United States Patent
Itai et al.

(10) Patent No.: US 7,737,632 B2
(45) Date of Patent: Jun. 15, 2010

(54) ORGANIC EL ELEMENT WITH LAMINATION STRUCTURE AND ITS MANUFACTURING METHOD

(75) Inventors: Yuichiro Itai, Kanagawa (JP); Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 778 days.

(21) Appl. No.: 11/587,692

(22) PCT Filed: Apr. 27, 2004

(86) PCT No.: PCT/JP2004/006047

§ 371 (c)(1),
(2), (4) Date: Oct. 26, 2006

(87) PCT Pub. No.: WO2005/107329

PCT Pub. Date: Nov. 10, 2005

(65) Prior Publication Data
US 2007/0231597 A1    Oct. 4, 2007

(51) Int. Cl.
H01J 1/62 (2006.01)
H01J 63/04 (2006.01)
B32B 9/00 (2006.01)
B32B 19/00 (2006.01)

(52) U.S. Cl. .................. 313/506; 313/504; 428/690
(58) Field of Classification Search .................. None
See application file for complete search history.

(56) References Cited

U.S. PATENT DOCUMENTS

| 6,897,473 | B1 * | 5/2005 | Burroughes et al. ......... 257/40 |
| 2002/0079489 | A1 * | 6/2002 | Ishikawa et al. ............ 257/40 |

FOREIGN PATENT DOCUMENTS

| JP | 7-138739 A | 5/1995 |
| JP | 8-120442 A | 5/1996 |
| JP | 9-256142 A | 9/1997 |
| JP | 10-270171 A | 10/1998 |
| JP | 11-92915 A | 4/1999 |
| JP | 2001-214159 A | 8/2001 |
| JP | 2002-198179 A | 7/2002 |
| JP | 2003-313654 A | 11/2003 |
| JP | 2003-347051 A | 12/2003 |
| JP | 2004-71506 A | 3/2004 |
| JP | 2004-127627 A | 4/2004 |
| JP | 2004-127639 A | 4/2004 |

OTHER PUBLICATIONS

C.W. Tang et al., Applied Physics Letters, vol. 51, No. 12, Sep. 21, 1987, pp. 913-915.
C.W. Tang et al., Applied Physics Letters, vol. 65, No. 9, May 1, 1989, pp. 3610-3616.

* cited by examiner

Primary Examiner—Toan Ton
Assistant Examiner—Britt D Hanley
(74) Attorney, Agent, or Firm—Birch, Stewart, Kolasch & Birch, LLP (57) ABSTRACT

There is provided an organic EL element having, between a positive electrode and a negative electrode, a lamination structure formed of organic films having a light emitting layer, a hole transport layer adjacent to a positive electrode side of the light emitting layer, and an electron transport layer adjacent to a negative electrode side of the light emitting layer. At least one of the organic films composing the lamination structure includes a metal element having reactivity to oxygen or water.

6 Claims, 7 Drawing Sheets

ORGANIC EL ELEMENT WITH LAMINATION STRUCTURE AND ITS MANUFACTURING METHOD

TECHNICAL FIELD

The invention relates to an organic electroluminescence element (hereinafter called organic EL element) in general, and more particularly relates to an organic EL element having a long life.

RELATED ART

Organic EL elements have properties including spontaneous light, high speed response and the like, and are expected to be applied to plane display devices or the like.

Since the lamination device having a hole transporting organic film and an electron transporting organic film in a laminated manner has been reported (C. W. Tang and S. A. VanSlyke, Applied Physics Letters, vol. 51, 913 (1987)), the organic EL element is attracting attention as a large area luminous element for emitting light at low voltage of 10 V or less. This conventional organic EL element emits a green light.

Figure 1:
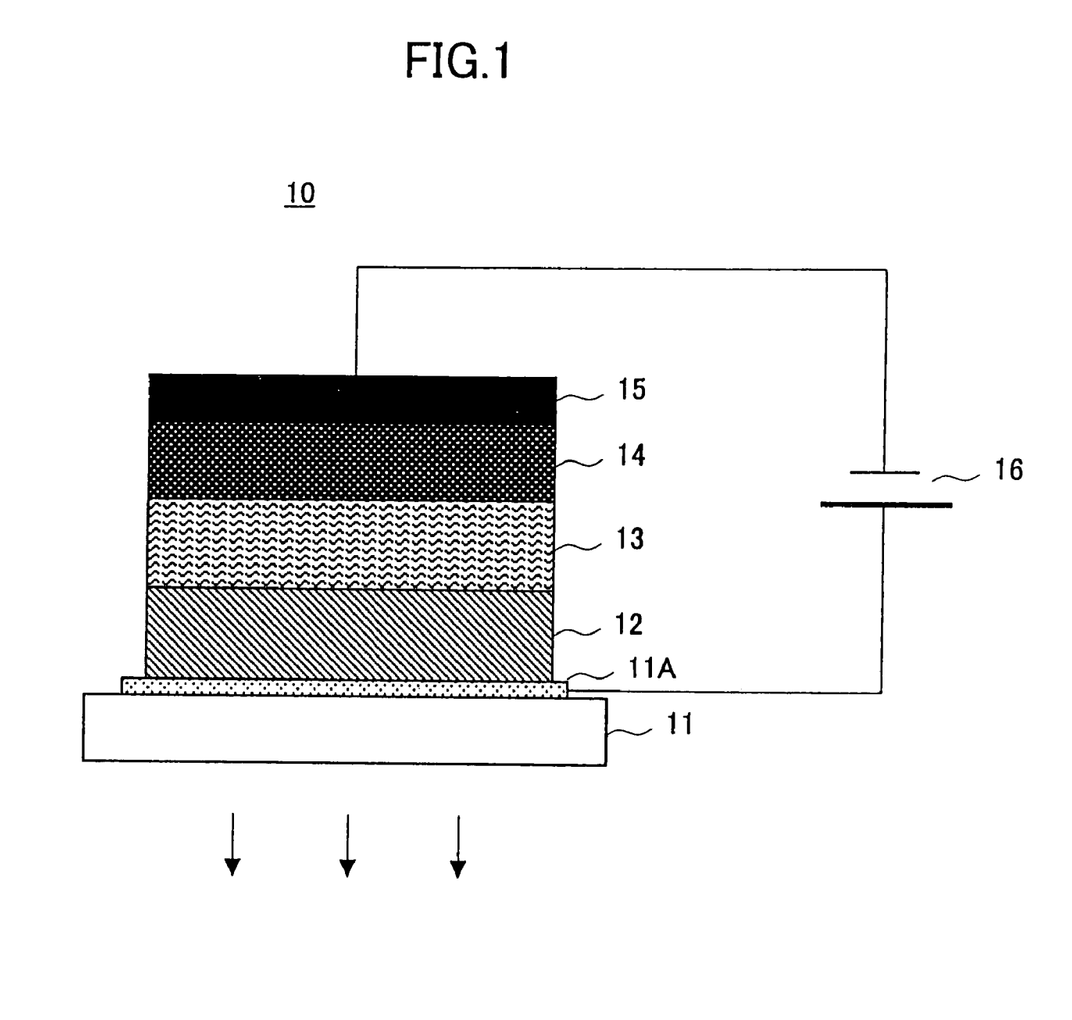
FIG. 1 is a diagram of a configuration of a conventional organic EL element.

FIG. 1 shows a typical structure of laminated organic EL element 10.

In FIG. 1, the organic EL element 10 has a lamination structure including a hole transport layer 12 which has the hole transporting organic film and is formed on a transparent substrate 11 formed of glass or the like carrying a transparent electrode 11A such as ITO ($In_2O_3.SnO_2$), a light emitting layer 13, and an electron transport layer 14 which is formed of an electron transporting organic film. An electrode 15 formed of Al or the like is formed on the electron transport layer 14.

Herein, as shown in FIG. 1, a direct-current driving power source 16 is provided, and a negative voltage is applied from the direct-current driving power source 16 to the electrode 15 contacting with the electron transport layer 14, and a positive electrode is applied to the electrode 11A contacting with the hole transport layer 12, and hence a hole is injected in the light emitting layer 13 through the hole transport layer 12, and an electron is injected through the electron transport layer 14, and by recombination of electron and hole in the light emitting layer 13, desired emission occurs in the light emitting layer 13 at wavelength corresponding to the energy gap of the light emitting layer 13.

The function of the light emitting layer 13 may be also played by the hole transport layer or electron transport layer, same as in the case of two-layer element proposed by Tang and VanSlyke. Further, in view of obtaining an organic EL element having high emission efficiency, in addition to a single layer formed of one material, a pigment doped layer, in which a small amount of pigment molecule having high fluorescent emission property is doped in the host material which is a main component thereof, is proposed as one constituent in configuration of a luminous layer (C. W. Tang, S. A. VanSlyke, and C. H. Chen, Applied Physics Letters, vol. 65, 3610 (1989)).

Patent Document 1: Japanese Patent Application Laid-Open (JP-A) No. 7-138739

Patent Document 2: JP-A No. 8-120442

Patent Document 3: JP-A No. 11-92915

Patent Document 4: JP-A No. 9-256142

Patent Document 5: JP-A No. 2003-313654

SUMMARY OF THE INVENTION

At the present, various element structures and organic materials are proposed for organic EL elements, and luminance of about 1,000 $cd/m^2$ is achieved at driving voltage of 10 V.

This value of luminance is, however, one that is obtained upon start of driving, and when the organic EL element is continuously driven, the optical output drops and the driving voltage elevates with the course of time, and the element is short-circuited at a certain stage due to the high driving voltage, and the organic EL element is broken.

Figure 2:
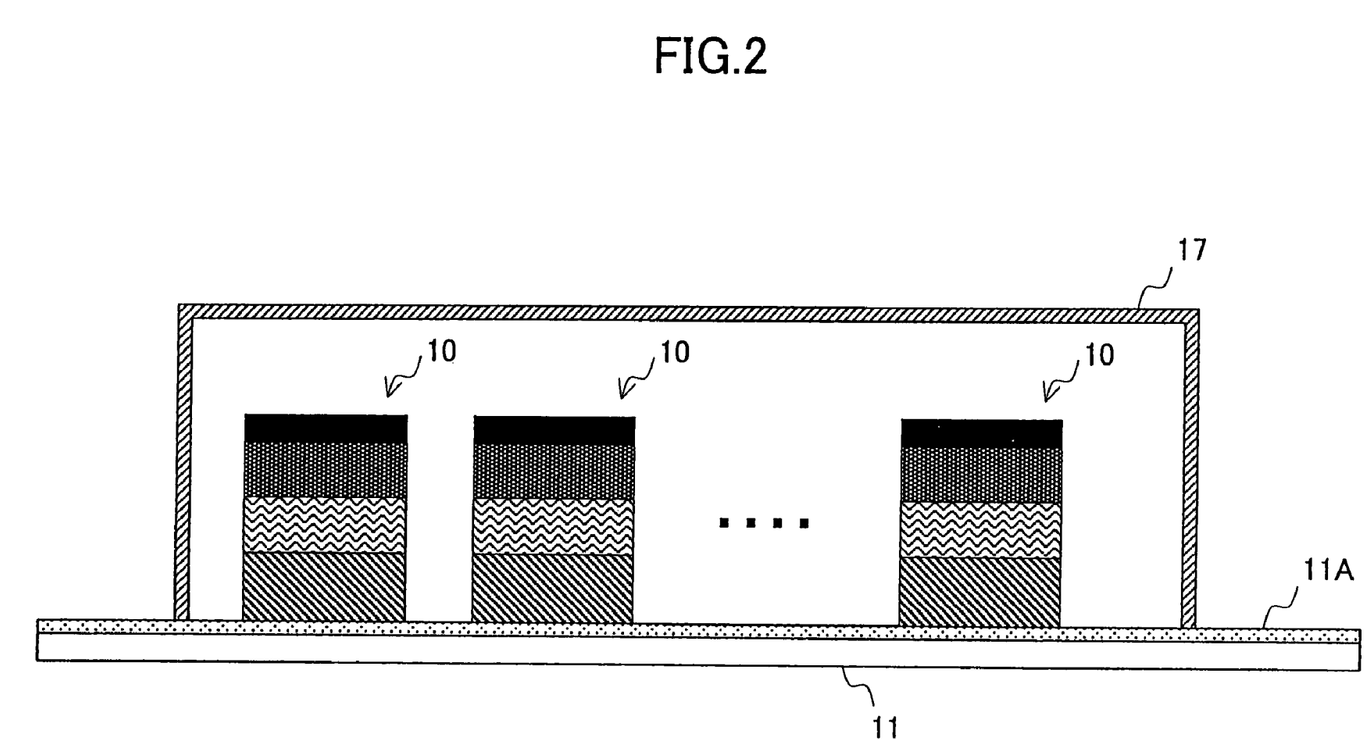
FIG. 2 is a diagram of a configuration of a conventional organic EL display panel.

Such rapid deterioration of an organic EL element is known to occur particularly when oxygen, water or other foreign matter is present in the organic EL element. Therefore, in a display device using such a conventional organic EL element, the display region composed of sequence of organic EL element 10 is covered with an airtight cover 17, as shown in FIG. 2, and the inside of airtight cover 17 is packed with dry nitrogen or the like so as to suppress deterioration of organic material.

In such a configuration, however, although invasion of foreign matter from outside after assembly of the display device can be prevented, deterioration due to a foreign matter taken into the organic material during the manufacture of the organic EL element cannot be prevented.

The invention provides a method for manufacturing an organic EL element capable of suppressing intake of foreign matters into the element structure during manufacture of the organic EL element, so as to realize a longer element life, and an organic EL element manufactured by the manufacturing method.

One aspect of the invention is a method for manufacturing an organic EL element including a substrate and a lamination structure formed of organic films on the substrate, the laminated structure including at least a hole transport layer, a light emitting layer, and an electron transport layer, the method comprising: depositing each of the organic films composing the lamination structure, wherein at least a part of the depositing is executed in the presence in the vicinity of the substrate of a metal element having reactivity to oxygen or water.

Another aspect of the invention is an organic EL display panel comprising: a transparent substrate; a sequence of a plurality of organic EL elements, provided to cover the transparent substrate; and an airtight cover, provided over the transparent electrode so as to cover the plurality of organic EL elements so as to form a space filled with an inert gas; wherein each organic EL element comprises, between a positive electrode and a negative electrode, a lamination structure formed of organic films comprising at least a light emitting layer, a hole transport layer adjacent to the positive electrode side of the light emitting layer, and an electron transport layer adjacent to the negative electrode side of the light emitting layer, and wherein at least one of the organic films composing the lamination structure includes a metal element having reactivity to oxygen or water.

According to the invention, when depositing each organic film composing the lamination structure, a metal element having reactivity to oxygen and water is disposed near the substrate on which the organic film is deposited, impurities such as oxygen and water which are taken into the lamination structure in a case where the metal element is not present, is removed in the manufacturing process of organic EL element, and the removed impurities are not returned to the lamination structure. The organic EL element thus manufactured has a feature of having the metal element in the lamination structure, and hence has a long life.

Other objects and features of the invention will be more clearly understood from the following detailed description of the invention taken in conjunction with the accompanying drawings.

DETAILED DESCRIPTION OF THE INVENTION

First Embodiment

Figure 3:
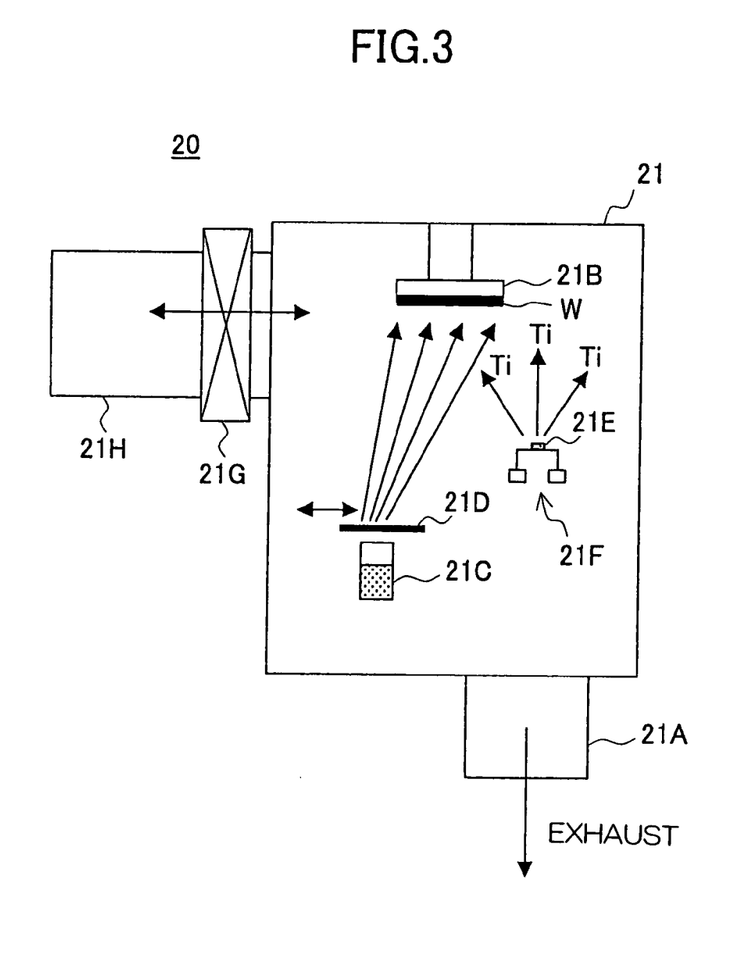
FIG. 3 is a diagram of a configuration of a vacuum deposition apparatus used in the invention.

FIG. 3 shows a configuration of a vacuum deposition apparatus 20 used in the invention.

As shown in FIG. 3, the vacuum deposition apparatus 20 has a vacuum tank 21 which is typically to be evacuated to a pressure of $1 \times 10^{-4}$ to $1 \times 10^{-5}$ Pa from a exhaust port 21A connected to a high vacuum exhaust system such as a rotary pump, a cryo pump, or a turbo molecular pump. A substrate holding bench 21B for holding a substrate W to be processed is provided in the vacuum tank 21. Further, a cell 21C, which holds the organic raw material, is provided oppositely to the substrate W to be processed on the substrate holding bench 21 in the vacuum tank 21.

A shutter mechanism 21D cooperates with the cell 21C, and a heating mechanism 21F for electrically heating a Ti wire 21E is provided near the substrate W.

A substrate delivery/discharge port 21H having a gate valve 21G is formed in the vacuum tank 21.

When the vacuum deposition apparatus is in operation, the cell 21C is heated to a certain temperature, and the shutter mechanism 21D is opened so that a desired film such as organic film deposits on the surface of the substrate W to be processed on the substrate holding bench 21B.

At this time, in the vacuum deposition apparatus 20 in FIG. 3, the heating mechanism 21F is driven so that Ti atoms are discharged from the Ti wire 21E to the inside of the vacuum tank 21. The discharged Ti atoms react with oxygen or water, which are discharged to the inside of the vacuum tank 21 as a result of evaporation of organic materials from the cell 21C, oxygen or water, which remain in the vacuum tank 21,or oxygen or water, which stick to the wall of the vacuum tank 21, and inactivate them. namely, the Ti atoms act as getter metal elements.

Figure 4:
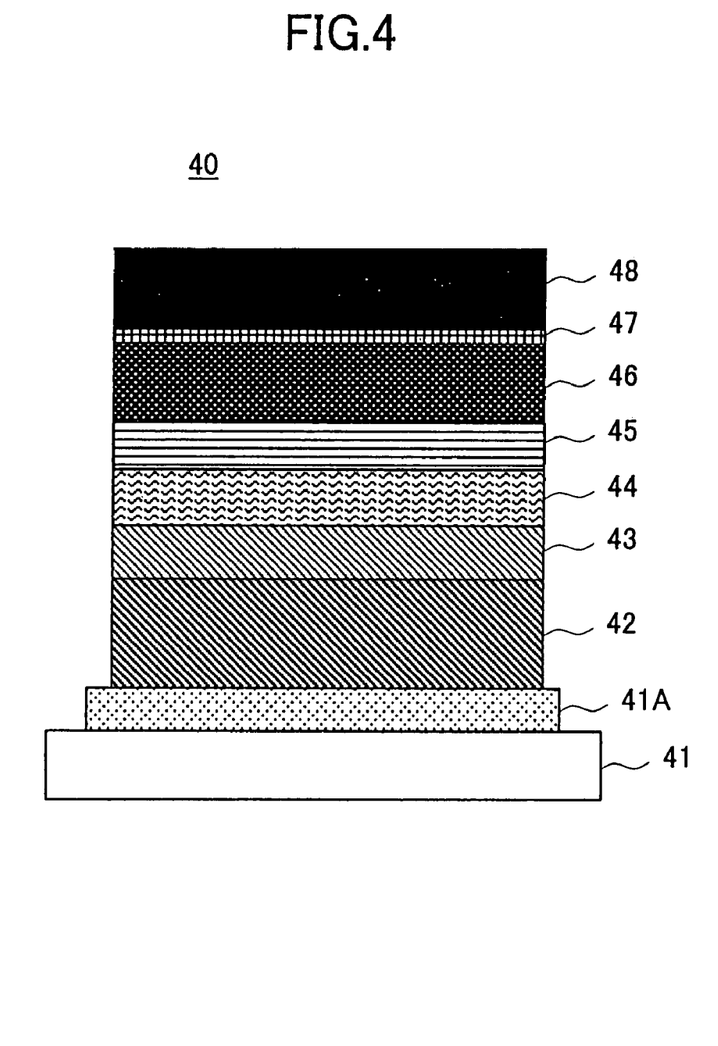
FIG. 4 is a diagram of a configuration of an organic EL element in a first embodiment of the invention.

FIG. 4 shows a configuration of an organic EL element 40 in the first embodiment of the invention manufactured by the vacuum deposition apparatus 20 in FIG. 3.

In FIG. 4, the organic EL element 40 is formed on a glass substrate 41 which carries an ITO electrode pattern 41A (positive electrode). On the ITO electrode pattern 41A, a hole injection layer 42, which is typically formed of a commercially-available 2-TNTA (4,4',4"-tris (2-naphtyl phenylamino)triphenylamine), which is expressed in the following formula:

to have a film thickness of 140 nm, is formed. On the hole injection layer 42, a hole transport layer 43, which is typically formed of a commercially-available α-NPD (N,N'-dinaphtyl-N,N'-diphenyl[1,1'-biphenyl]-4,4'-diamine), which is expressed in the following formula:

to have a film thickness of 10 nm, is formed. On the hole transport layer 43, a light emitting layer 44, which is typically formed of a commercially-available CBP (4,4'-bis(9-carbazolyl)-(biphenyl)), which is expressed in the following formula:

to have a film thickness of 20 nm, is formed. On the light emitting layer 44, a hole blocking layer 45, which is typically formed of a commercially-available BAlq manufactured by SynTec GmbH Wolfen, which is expressed in the following formula:

to have a film thickness of 10 nm, is formed. On the hole blocking layer 45, an electron transport layer 46, which is typically formed of a commercially-available $Alq_3$, which is expressed in the following formula:

to have a film thickness of 20 nm, is formed. On the electron transport layer 46, an LiF electron injection layer 47, which is typically formed to have a film thickness of 0.5 nm. On the electron injection layer 47, an Al electrode 48 which is formed to have a film thickness of 100 nm. The hole transport layer 42 is doped by an acceptor of a commercially-available F4TCNQ (2,3,5,6-tetrafluoro-7,7,8,8 tetracyano quinodimethane) manufactured by Tokyo Kasei Co. expressed in the following formula at a concentration of 0.1%.

Further, the light emitting layer 44 is doped by tbppy (1,3,6, 8-tetrabiphenyl pyrene) expressed in the following formula at concentration of 10%.

The organic EL element 40 in FIG. 4 emits light at driving voltage of 4 V or more, and radiates a blue light.

A method of manufacturing the organic EL element shown in FIG. 4 including using the vacuum deposition apparatus 20 in FIG. 3 is explained below.

Figure 5:
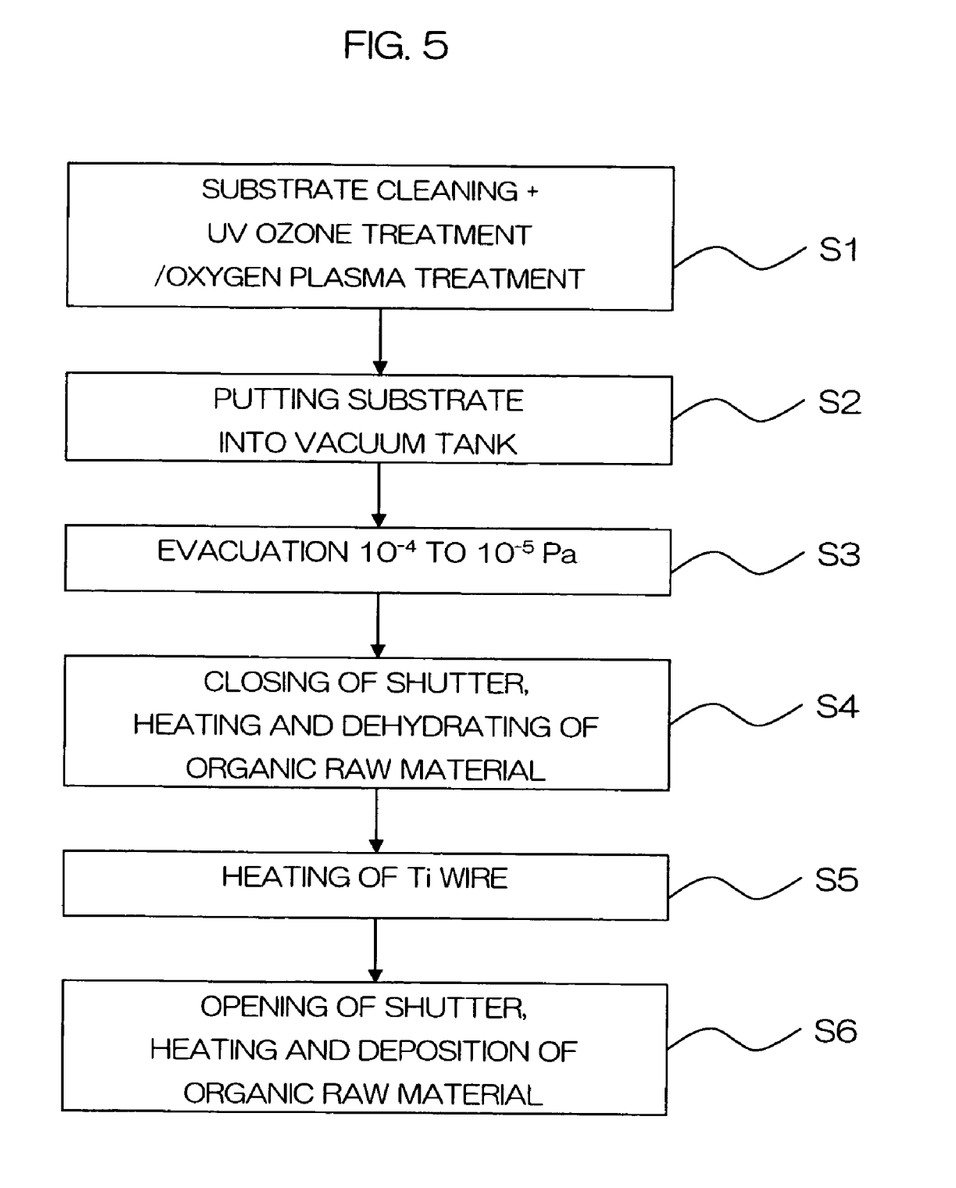
FIG. 5 is a diagram of a manufacturing method of an organic EL element in the first embodiment of the invention.

FIG. 5 is a flowchart explaining the method of manufacturing the organic EL element shown in FIG. 4.

In FIG. 5, first at step 1, the glass substrate forming the ITO electron pattern 41A at a thickness of 150 nm is cleaned ultrasonically by acetone and isopropyl alcohol, and the cleaned substrate is treated by UV ozone or oxygen plasma. At step 2, it is put into the vacuum tank 21 of the vacuum deposition apparatus 20 as the substrate W to be processed. In the case of UV ozone treatment, the substrate is irradiated with UV in atmosphere for 20 minutes.

At step 3, the vacuum tank 21 is evacuated to a high vacuum state of $1 \times 10^{-4}$ to $10^{-5}$ Pa, and at step 4, with the shutter 21D in FIG. 4 closed, and the cell 21C is heated by using resistance heater or electron beam, and the organic raw material contained in the cell 21 is dehydrated.

Further at step 4, the heating mechanism 21F is driven, and the Ti wire 21E is heated, and Ti atoms are released into the vacuum tank 21. As a result, oxygen and water released into the vacuum tank 21 by dehydration of organic raw material at step 4 are captured by Ti atoms, and inert Ti oxide or hydroxide is formed, and is fixed on the inner wall of the vacuum tank 21, thereby inhibiting return to the organic raw material, or absorption in the organic film formed on the substrate W to be processed.

At step 6, the shutter 21D is opened, and the deposition cell 21C is heated, and the hole injection layer 42, hole transport layer 43, light emitting layer 44, hole blocking layer 45, electron transport layer 46, electron injection layer 47, and Al electrode layer 48 are formed on the substrate according to the composition in FIG. 4, sequentially by vacuum deposition. For this purpose, a plurality of deposition cells 21C holding the respective raw materials are disposed in the vacuum tank 21. In the deposition process, the substrate temperature of the substrate W to be processed is set at room temperature.

More specifically, the hole injection layer 42 is formed by depositing 2TNATA and F4-TCNQ at speeds of 0.1 nm/sec and 0.0001 nm/sec respectively, and the hole transport layer 43 is formed by depositing α-NPD at a speed of 0.1 nm/sec.

The light emitting layer 44 is formed by depositing CBP and tbppy at speeds of 0.09 nm/sec and 0.01 nm/sec respectively. The hole blocking layer 45 is formed by depositing BAlq at speed of 0.1 nm/sec, and the electron transport layer 46 is formed by depositing $Alq_3$ at speed of 0.1 nm/sec. The LiF electron injection layer 47 and Al electrode layer are formed by depositing LiF and Al at speeds of 0.01 nm/sec and 1 nm/sec respectively.

The heating process of Ti wire 21E at step 5 is stopped immediately before the start of step 6, and therefore in the deposition process at step 6, Ti atoms are not discharged from the Ti wire 21E, but the Ti atoms discharged into the vacuum tank 21 at the preceding step 5 still remain in the vacuum tank 21,and these atoms capture the oxygen or water molecules existing near the surface of the substrate W to be processed, and inactivate them. Accordingly, even if raw material particles released at high temperature from the deposition cell 21C cool while moving through the vacuum tank 21 to near to the surface of the substrate W to be processed, incorporation of oxygen or water into the raw material particles can be effectively suppressed.

Comparative example 1 of the same composition as in FIG. 4 was formed in the same way as the organic EL element of the embodiment but by omitting step 5 in FIG. 5, that is, the step of discharge of Ti atoms into vacuum tank 21. In comparative example 2 of the embodiment, an organic EL element of same composition as in FIG. 4 was formed by omitting step 4 in FIG. 5, that is, the dehydrating process of organic raw material and omitting the process of step 5 in FIG. 5.

The organic EL element 40 of the embodiment, the organic EL element of comparative example 1, and the organic EL element of comparative example 2 obtained in these manners were driven at a driving voltage of 7 V, and driving current density of 15 $mA/cm^2$, and a high emission efficiency was obtained just after the start of driving in all elements, and after continuous driving for 200 hours, the relative luminance was compared with the luminance just after the start of driving, and as shown in Table 1, the relative luminance was 0.71 in the organic EL element 40 of the embodiment, but was lowered to 0.64 in comparative example 1, and 0.38 in comparative example 2.

TABLE 1

|  | Emission efficiency | Relative luminance | |
| --- | --- | --- | --- |
|  | (cd/A) 15 $mA/cm^2$ | 0 H | 200 H |
| Comparative example 1 | 3.15 | 1 | 0.64 |
| Comparative example 2 | 2.42 | 1 | 0.38 |
| Example | 3.30 | 1 | 0.71 |

As seen from the results in Table 1, as in comparative example 2, if the raw material is not heated when forming each organic layer of organic EL element by vacuum deposition process, oxygen or moisture in raw material is incorporated into the element, with a fatal effect on the life of organic EL element, or as in comparative example 1, when simply heated, the life of organic EL element is improved, but the life is further extended by inactivating the oxygen or moisture remaining in the vacuum tank, in addition to the dehydrating process, as in the embodiment. In particular, as compared with comparative example 1, the organic EL element of the embodiment has a longer life, which suggests that if the organic raw material is simply heated as at step 4 in FIG. 5 desorbed oxygen or moisture remaining in the vacuum tank 21 cannot be avoided, and is incorporated into the organic EL element on the substrate W to be processed, even if the vacuum tank 21 is evacuated to a high vacuum degree by a high performance pump.

In the invention, since the Ti discharge process of step 5 is executed immediately before deposition process at step 6, incorporation of Ti into each layer of organic EL element 40 cannot be avoided, and as a result of XPS analysis, indeed, it is confirmed that Ti is contained in the organic EL element 40. However, as suggested by the results in Table 1, as the emission efficiency is compared with the result right after start of driving, such presence of Ti does not have any adverse effect on the emission characteristics of the organic EL element, but the emission efficiency is shown to be improved, up to 3.30 cd/A, by the decrease in impurities. In the organic EL elements of comparative example 1 and comparative example 2, since step 5 is omitted, it must be noted that Ti is not contained in the element structure. In spite of this fact, however, in these elements, the emission efficiency just after the start of driving remains at 3.15 cd/A and 2.42 cd/A.

Thus, the invention is based on the finding that there is no adverse effect on the emission characteristics if a metal element such as Ti is contained in the organic EL element, and by using such a getter metal element, the invention presents an organic EL element high in emission efficiency and with reduced deterioration with aging, and an organic EL element display panel using the same.

The metal is not limited to Ti alone, but similar effects are obtained by using Si, Al, or Cr.

The invention is not limited to organic EL element of specific material system, but is also effective for improving the element life in, for example, the conventional organic EL element for emitting green light shown in FIG. 1, or organic EL elements for emitting red, white or other color light.

In the vacuum deposition apparatus 20 in FIG. 3, heating of Ti wire 21E is not limited to direct power feeding to the wire, but includes a method of winding the Ti wire around a metal wire with a high melting point such as W, and feeding power to the metal wire with high melting point. The heating means of Ti wire 21E is not limited, and, for example, a metal ribbon of wide area may be used instead of wire 21E.

In addition to the constitution above, by forming a large exposed surface of the getter metal in the vacuum tank 21, free oxygen or water in the vacuum tank 21 may be captured by the exposed surface.

Second Embodiment

Figure 6:
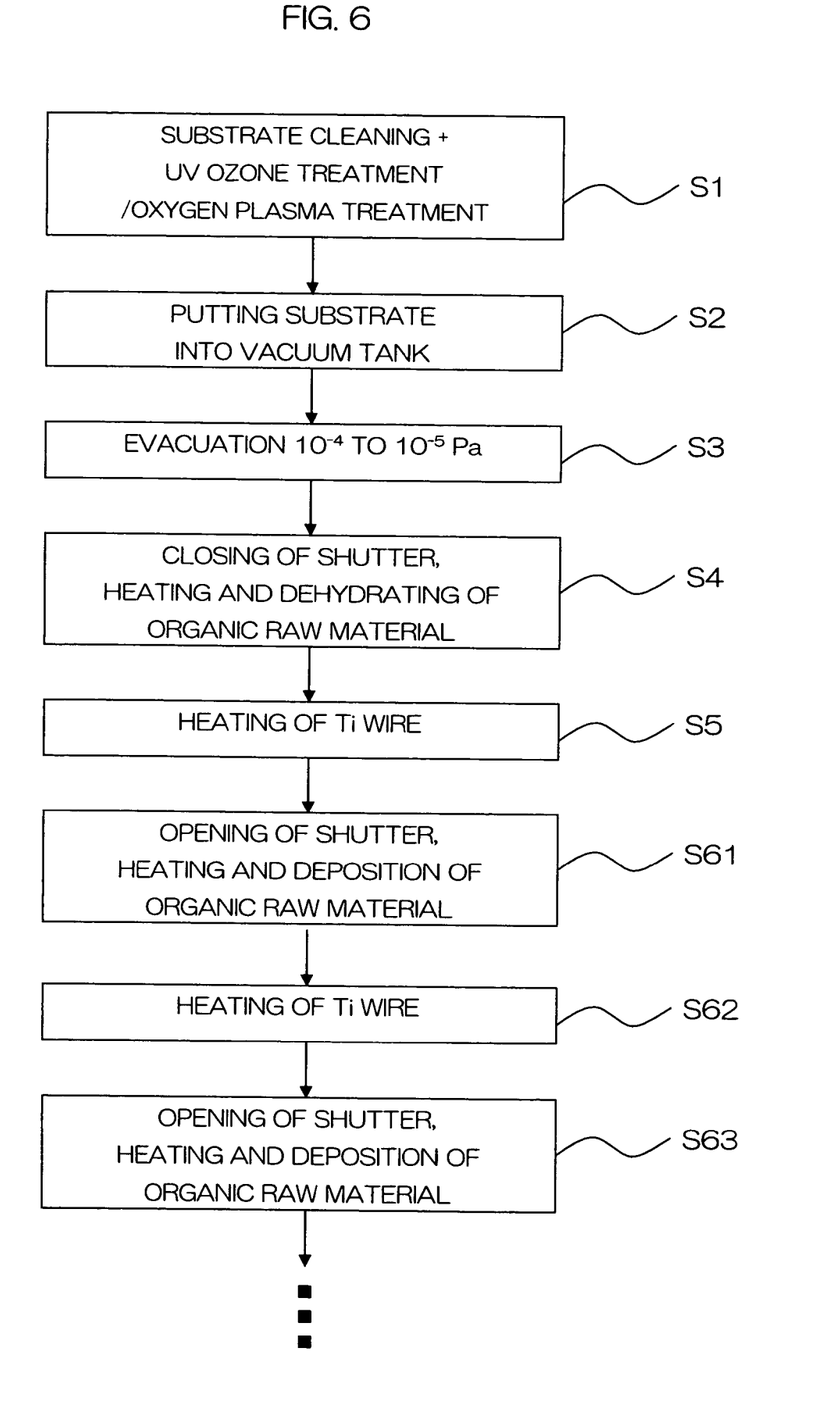
FIG. 6 is a diagram of a manufacturing method of an organic EL element in a second embodiment of the invention.

FIG. 6 is a flowchart showing a method for manufacturing an organic EL element in a second embodiment of the invention. In the diagram, the same parts as in the above explanation are identified with same reference numerals, and the description thereof is omitted.

At step 6 in FIG. 5, all layers 42 to 48 are formed sequentially on an ITO electrode of pattern 41A of FIG. 4, but in the process of the embodiment, in FIG. 6, after Ti discharge process at step 5, heating of Ti wire 41E is stopped at step 61, and only the hole injection layer 42 is formed by the vacuum deposition apparatus 20 of FIG. 3, by opening the shutters of the cell holding the 2-TNATA and the cell holding the F4-TCNQ. Then, at step 62, the Ti discharge process is executed again.

Further, at step 63 the Ti discharge process is terminated, and the shutter of the cell holding α-NPD is opened, and hole transport layer 43 is formed, and by repeated alternate processing in a similar manner thereafter the lamination structure of FIG. 4 is formed in sequence.

In the organic EL element formed in this manner, since Ti atoms are discharged immediately before forming of each organic layer, and impurities in the vacuum tank 21, especially oxygen and water near the surface of the substrate W to be processed are removed, the concentration of impurities incorporated into the organic EL element can be further lowered.

As a result of these processes, the organic EL element manufactured in this embodiment is higher in Ti concentration near the interfaces of one layer with the next layer, and shows a characteristic Ti concentration distribution.

As mentioned above, in the invention, the metal used as getter is not limited to Ti, and Si, Al, Cr and other metal may be used, and even by using such metals, the emission characteristics of the organic EL element do not deteriorate.

Third Embodiment

Figure 7:
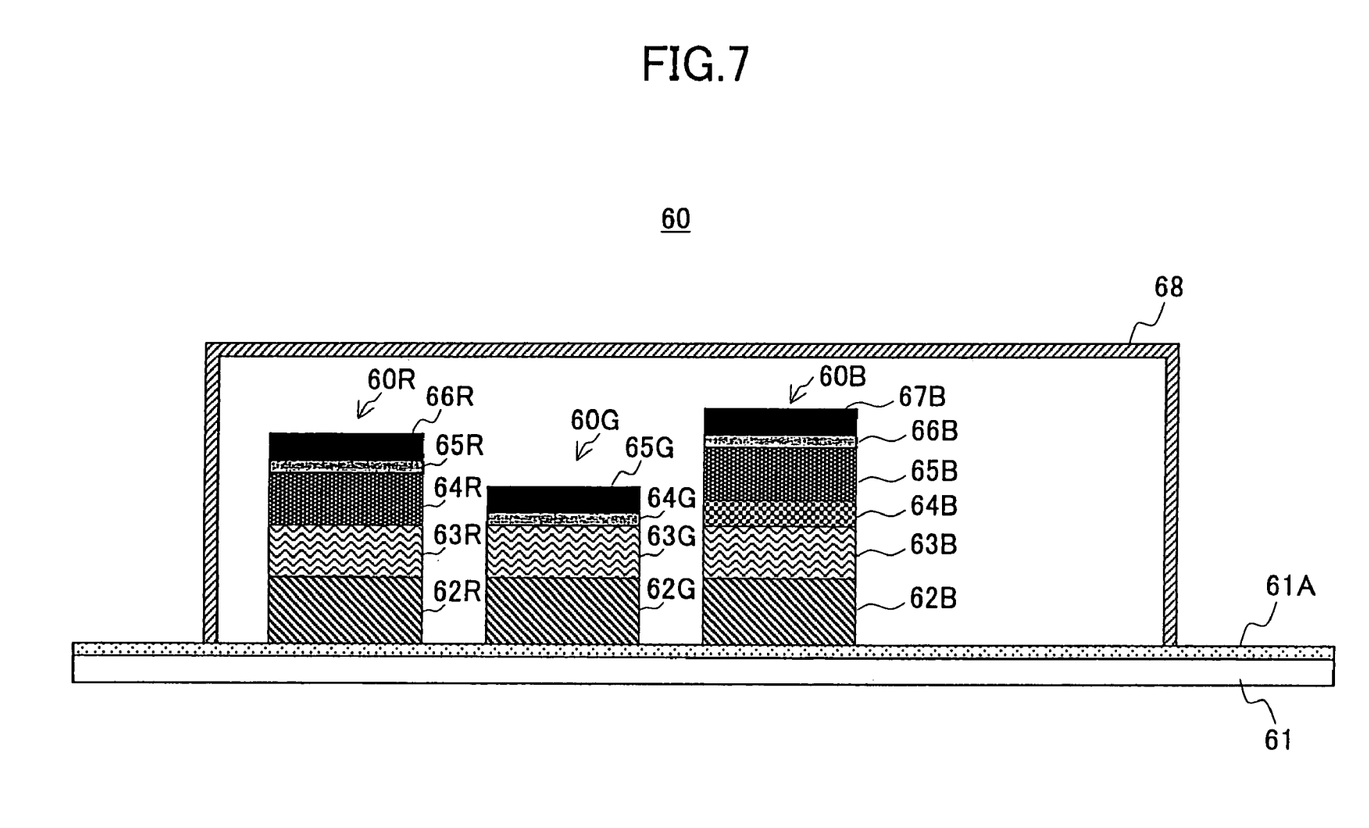
FIG. 7 is a diagram of a configuration of an organic EL display panel in a third embodiment of the invention.

FIG. 7 shows a configuration of a full color organic EL display panel 60 in a third embodiment of the invention.

In FIG. 7, the organic EL display panel 60 is formed on a glass substrate 61 carrying an ITO electrode pattern 61A, and includes a sequence of display elements composed of repetition of an organic EL element 60R which emits red light, an organic EL element 60G which emits green light, and an organic EL element 60B which emits blue light. The organic EL elements 60R, 60G, 60B are formed in the process shown in FIG. 5 or FIG. 6 by using the vacuum deposition apparatus 20 shown in FIG. 3.

More specifically, the red organic EL element 60R has a lamination structure formed on the ITO electrode pattern 61A. The lamination structure has a hole injection layer 62R which is formed of α-NPD to have a film thickness of 50 nm; a red light emitting layer 63R which is formed of $Alq_3$ which contains, at concentration of 1 wt. %, DCJTB expressed in the following formula:

DCJTB to have a film thickness of 30 nm; an electron transport layer 64R which is formed of $Alq_3$ to have a film thickness of 30 nm; an electron injection layer 65R which is formed of LiF to have a film thickness of 0.5 nm; and an Al electrode layer 66R. Each one of the organic layers 62R to 64R contains a getter metal element of any one of Ti, Si, Al, and Cr. A concentration of the metal element is particularly high in the vicinity of the interface of one layer and another layer adjacent thereto.

Similarly, the green organic EL element 60G has a lamination structure formed on the ITO electrode pattern 61A. The lamination structure has a hole injection layer 62G which is formed of α-NPD to have a film thickness of 50 nm; a green light emitting layer 63G which is formed of $Alq_3$ to have a film thickness of 30 nm; an electron injection layer 64G which is formed of LiF to have a film thickness of 0.5 nm; and an Al electrode layer 65G. The organic layers 62G and 63G contain a getter metal element of any one of Ti, Si, Al, and Cr. A concentration of the metal element is particularly high in the vicinity of the interface of one layer and another layer adjacent thereto.

The blue organic EL element 60B has a lamination structure formed on the ITO electrode pattern 61A. The lamination structure has a hole injection layer 62B which is formed of α-NPD to have a film thickness of 50 nm; a blue light emitting layer 63B which is formed of CBP which contains, at concentration of 10 wt. %, tppy expressed in the following formula:

tppy to have a film thickness of 20 nm; a hole blocking layer 64B which is formed of BCP expressed in the following formula:

BCP to have a film thickness of 10 nm; an electron transport layer 65B which is formed of $Alq_3$ to have a film thickness of 50 nm; an electron injection layer 66B which is formed of LiF to have a film thickness of 0.5 nm; and an Al electrode layer 67B. Each one of the organic layers 62B to 65B contains a getter metal element of any one of Ti, Si, Al, and Cr. A concentration of the metal element is particularly high in the vicinity of the interface of one layer and another layer adjacent thereto.

All organic EL elements on the substrate 61 are covered with an airtight cover 68, and the inside of the airtight cover 68 is filled with an inert gas such as dry nitrogen gas.

In the organic EL element having such a configuration, the life of individual organic EL display elements is long due to the use of the getter metal element, and a practical life for the whole of the display panel is obtained.

While the invention are herein described based on the preferred embodiments, the invention is not limited to these specific embodiments, and may be changed and modified in various manners within the scope of the invention described in the appended claims.

INDUSTRIAL APPLICABILITY

According to the invention, when depositing each organic film for composing the lamination structure, near the substrate for depositing the organic films, a metal element reactive to oxygen or water is present, and therefore the oxygen or water taken into the lamination structure are removed at the time of manufacture of organic EL element, and removed impurities do not return to the lamination structure. The organic EL element thus manufactured includes the metal element in the lamination structure, and has an excellent element life.

The invention claimed is:

1. An organic EL element comprising, between a positive electrode and a negative electrode: a lamination structure formed of organic films comprising at least a light emitting layer, a hole transport layer adjacent to the positive electrode side of the light emitting layer, and an electron transport layer adjacent to the negative electrode side of the light emitting layer, wherein at least one of the organic films composing the lamination structure includes a metal element having reactivity to oxygen or water, wherein a concentration of the metal element increases at the vicinity of the interface of one layer and another layer adjacent thereto.

2. The organic EL element of claim 1, wherein the metal element comprises one selected from Ti, Si, Al, and Cr.

3. The organic EL element of claim 1, wherein the metal element is included in all organic layers composing the lamination structure.

4. An organic EL display panel comprising:

a transparent substrate;

a sequence of a plurality of organic EL elements, provided to cover the transparent substrate; and an airtight cover, provided over the transparent electrode so as to cover the plurality of organic EL elements so as to form a space filled with an inert gas; wherein each organic EL element comprises, between a positive electrode and a negative electrode, a lamination structure formed of organic films comprising at least a light emitting layer, a hole transport layer adjacent to the positive electrode side of the light emitting layer, and an electron transport layer adjacent to the negative electrode side of the light emitting layer, and wherein at least one of the organic films composing the lamination structure includes a metal element having reactivity to oxygen or water, wherein a concentration of the metal element increases at the vicinity of the interface of one layer and another layer adjacent thereto.

5. The organic EL display panel of claim 4, wherein the metal element comprises one selected from Ti, Si, Al, and Cr.

6. The organic EL display panel of claim 4, wherein the metal element is included in all organic layers composing the lamination structure.

* * * * *